(12) United States Patent
Langley

(10) Patent No.: US 6,487,087 B1
(45) Date of Patent: Nov. 26, 2002

(54) OPTICAL INTERFACE ARRANGEMENT

(75) Inventor: Lloyd Langley, Northampton (GB)

(73) Assignee: Bookham Technology plc (GB)

( * ) Notice: Subject to any disclaimer, the term of this patent is extended or adjusted under 35 U.S.C. 154(b) by 0 days.

(21) Appl. No.: 09/622,854

(22) PCT Filed: Jan. 27, 2000

(86) PCT No.: PCT/GB00/00231
§ 371 (c)(1),
(2), (4) Date: Dec. 4, 2000

(87) PCT Pub. No.: WO00/45207
PCT Pub. Date: Aug. 3, 2000

(30) Foreign Application Priority Data

Jan. 28, 1999 (GB) .............................................. 9901765

(51) Int. Cl.[7] .................................................. H05K 1/11
(52) U.S. Cl. ........................ 361/784; 361/748; 361/736; 361/749; 361/774; 361/792
(58) Field of Search ................................ 361/784, 749, 361/748, 736, 760–762, 777, 778, 779, 774, 773, 789, 792

(56) References Cited

U.S. PATENT DOCUMENTS 5,484,965 A * 1/1996 Woychik ..................... 174/262
5,545,924 A * 8/1996 Contolatis et al. ........... 257/724
5,717,556 A * 2/1998 Yanagida ..................... 361/803
6,105,226 A * 8/2000 Gore et al. ................. 29/25.35
6,172,881 B1 * 1/2001 Hirai ........................... 361/816

FOREIGN PATENT DOCUMENTS

| | | |
|---|---|---|
| DE | 32 46 661 A1 | 6/1984 |
| DE | 41 36 355 A1 | 5/1993 |
| EP | 0 710 861 A1 | 11/1995 |
| FR | 2 503 977 | 10/1982 |
| GB | 2 185 151 A | 7/1987 |
| GB | 2 322 974 A | 9/1998 |
| JP | 050 138 01 | 1/1993 |

* cited by examiner

Primary Examiner—David Martin
Assistant Examiner—Thanh Y. Tran
(74) Attorney, Agent, or Firm—Kirchstein, et al.

(57) ABSTRACT

An optical interface arrangement includes a tile carrying an optical component which is mounted substantially at right angles to a closely adjacent circuit board which carries an electrical circuit. The circuit board has an electrically conductive track extending to an edge of the board adjacent to an edge of the tile. The edge surface of the tile has a localized recess carrying an electrically conductive material which extends across the thickness of the tile and along a major surface of the tile to connect with the optical component. A short bondwire is provided which links the electrically conductive material in the recess to the adjacent electrically conductive track on the circuit board.

11 Claims, 2 Drawing Sheets

OPTICAL INTERFACE ARRANGEMENT

BACKGROUND OF THE INVENTION

This invention relates to an optical interface arrangement in which an optical signal is received or transmitted by a photoelectric device. The optical signal will usually be brought to, or transmitted from, the optical arrangement by means of an optical fiber.

In the case of a receiver, the photoelectric device will usually be a photodiode, for which an electrical amplifier can be placed after the photodiode to boost the electrical signal if necessary.

Such receivers can be used in a wide range of analogue and digital systems to convert the optical signals present in the optical fiber into electrical signals. Digital applications include telecommunications systems. Analogue applications include remote control of microwave transmitters and optically-fed phased array antennas. In such applications the broad-band high-frequency signals are transmitted over optical fiber. The optical modulation frequencies and hence the electrical carrier frequencies of interest are in the microwave and millimeter wave region.

At such high frequencies the minimization of unwanted parasitic elements of the electrical components and electrical connections becomes very important.

In a conventional photodiode the optical signal is directed at its surface. Usually such a photodiode is placed on a ceramic tile which is made of dielectric material. Metal tracks on the surface of the tile carry the detected electrical signal. Electrical connection from the tile to the photodiode is made using solder contacts.

In a conventional optical receiver design, the photodiode tile is placed horizontally on a flat surface adjacent to the electrical amplifier with both being in the same plane. By making the components small and placing them close together the length of the connecting bondwire can be minimized to maintain a low parasitic inductance and therefore minimize its detrimental effects.

Because of the surface entry design of a conventional photodiode the light must enter or leave from a direction orthogonal to the photodiode surface. The interfacing of the optical input from the optical fiber to the photodiode can be performed in several ways. For example, the fiber can be placed such that its axis is orthogonal to the photodiode surface so that the end of the optical fiber is placed close (butt coupled) to the photodiode detecting region and no intervening optical coupling or focusing components are required. Unfortunately, in many applications it is desirable to place the input fiber and an output electrical connector in the same plane as each other and in the same plane as a substrate carrying electrical circuits including the amplifier.

In such a case, this can be achieved by leaving the photodiode tile in the same plane as the electrical circuits, and by deflecting the light through 90° down onto the photodiode. The methods used for this technique could include the use of a focusing lens and prism, or a 45° polished fiber end. The manufacture of components and the optical alignment of these methods are more difficult than that of the simple butt coupling method.

One way to avoid the 90° deflection of the light into the photodiode is to place the photodiode tile at right angles to the substrate which carries the electrical circuits, but it is difficult to use conventional wire-bonding equipment to bond around such a 90° corner, and also the bondwire can be excessively long, introducing too much parasitic inductance and hence degrading the performance. One known arrangement in which the photodiode plane is at right angles to that of the electrical circuits is disclosed in UK patent application GB 2185151A, in which the photodiode tiles are formed from a larger substrate which is sawn partway through in a series of parallel lines where the edge of the photodiode tiles will be. Patterning of electrically conductive tracks is then performed which pass around the tile edge into the troughs made by the partial sawing. The substrate is then turned over and sawn up into individual tiles by sawing the rest of the way through the substrate from the opposite face. Thus, the resultant track goes around the edge of the tile and continues partway along the edge of the tile. The length of the bondwire linking the photodiode to the electrical substrate is minimized by such an arrangement, but it has disadvantages in that a relatively thick phototile is required, and the electrically conductive tracks extend only partway along the edge thickness of the tile.

SUMMARY OF THE INVENTION

The present invention seeks to provide an improved optical interface arrangement. According to a first aspect of this invention, an optical interface arrangement comprises: a tile carrying an optical component which is mounted substantially at right angles to a closely adjacent substrate which carries an electrical circuit and which has an electrically conductive track extending to an edge of the substrate adjacent to an edge of said tile; the edge surface of said tile having a localized recess carrying an electrically conductive material which extends across the thickness of the tile and along a major surface of said tile to connect with said optical component, and a short bondwire linking the electrically conductive material in said recess to the adjacent electrically conductive track on the substrate.

According to a second aspect of this invention, a method of making an optical interface arrangement includes the steps of: forming an array of holes through a sheet of tile material; coating the walls of the holes with an electrically conductive material, dividing said sheet into a plurality of smaller tiles such that an edge of each tile passes through a hole to leave a recess on that edge which carries electrically conductive material; mounting an optical component on each tile so that it is electrically connected to said electrically conductive material; mounting each tile at right angles to an adjacent substrate which carries an electrically conductive track; and linking said electrically conductive track to said material in the recess by means of a short bondwire.

BRIEF DESCRIPTION OF THE DRAWINGS

The invention is further described by way of example with reference to the accompanying drawings in which.

DETAILED DESCRIPTION OF THE PREFERRED EMBODIMENTS

An optical interface arrangement can include an optical component such as a photodiode which acts as an optical receiver or a laser which acts as an optical transmitter, and in each case an optical fiber will be positioned to conduct light towards or away from the optical component. In the case of a photodiode receiver, the diode is connected to an amplifier, and as the arrangement is typically intended to operate at very high frequencies in the microwave region, the amplifier must be positioned closely adjacent to the diode to minimize inductive signal loss by enabling the use of a short bondwire. Similar considerations apply to an optical transmitter.

Figure 1:
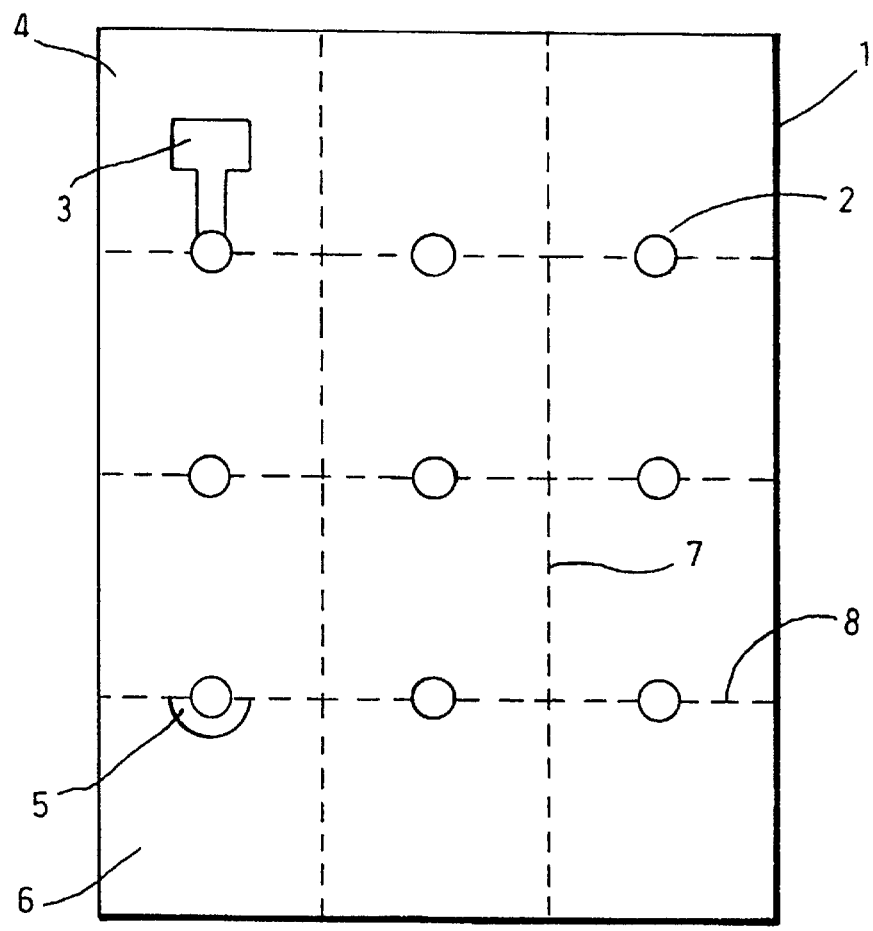
FIGS. 1, 2, 3 and 4 show steps in the making of an optical interface arrangement.

Referring to FIG. 1, there is shown therein a sheet 1 of tile material having an array of holes 2, formed therein. By tile material is meant a stable material such as a ceramic, for example alumina or aluminum nitride, on which the photodiode or laser can be directly mounted. Typically the tile material is about 250 µm thick. The holes 2 are drilled, e.g., by a laser, so that the holes pass right through the thickness of the sheet 1 to form circular windows, and each hole typically has a diameter of 300 to 500 µm. A metal layer is deposited onto both sides of the sheet 1, e.g., by sputtering or an electro-plating deposition process. The metal layer may be deposited by a multilayer process, depending on the material of the sheet. Typically, titanium or platinum would form the first layer with a top coating of gold to give good electrical conductivity. The top conductive surface of the sheet is etched to leave a pattern of conductive tracks, e.g., illustrated in tile 4, and it is to this top surface that the photodiodes are attached subsequently, one photodiode to each tile. The rear conductive surface of the sheet constitutes a ground plane, and is etched locally around the holes 2 so as to be isolated from the conductive material which coats the walls of the holes 2, the isolating region 5 from which the conductive material has been removed being shown in tile 6. In practice, of course, each tile is identical.

The pattern of conductive tracks 3 may be more complex than that shown, and smaller diameter conductive via holes can be provided in each tile to give electrical connection between the two major surfaces of the sheet 1, to permit convenient electrical interconnection and earthing to ground of the photodiode. The track 3 can be of any configuration, e.g., coplanar or microstrip.

The sheet 1 is then sawn along the broken lines 7 and 8 to form a number of individual tiles, all of which are identical. In particular, lines 8 pass through the center of holes 2, so that each tile has a semicircular recess in one edge, and the walls of this recess are coated with an electrically conductive material which is electrically connected to each track 3, but is electrically isolated from the conductive ground plane on the other side of the tile.

Figure 2:
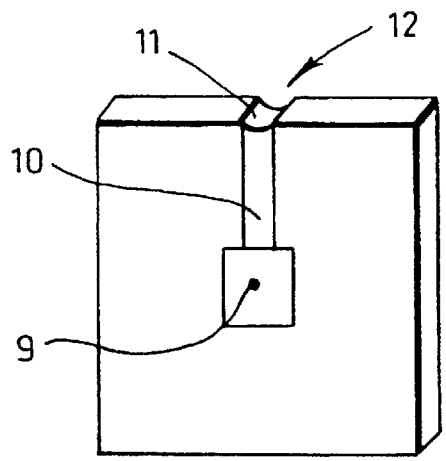
Figure 3:
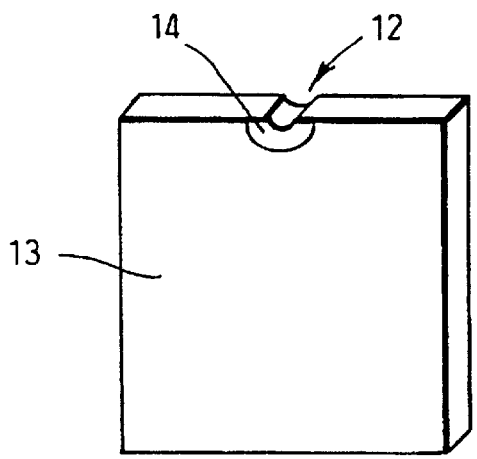

Referring to FIGS. 2 and 3, an individual tile so formed is shown in greater detail. A photodiode 9 is mounted on a conductive track 10 on the front surface, and this conductive track is electrically continuous with the conductive material 11 on the walls of the recess 12. A ground plane 13 extends across the whole of the rear surface of the tile, except for an isolation region 14 which bounds the recess 12.

Figure 4:
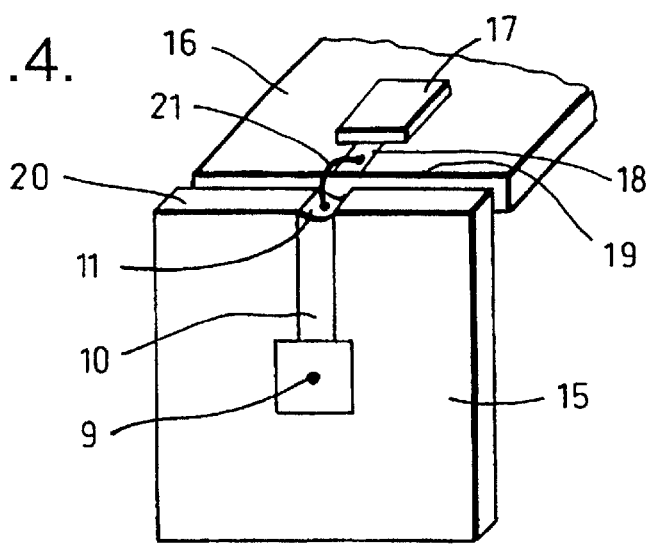

FIG. 4 shows a tile 15, which corresponds to the view of the tile shown in FIG. 2, and the tile is mounted very closely adjacent to the end edge of a printed circuit board 16, which carries an amplifier 17, and otherelectrical circuits, not shown, as may be required.

The surface of the board 16 carries a conductive track 18 extending from the amplifier 17 to the edge 19 of the board adjacent to the edge 20 of the tile 15. A conductive bondwire 21 extends from the recess 12 to the track 18 so as to make electrical connection therebetween. This bondwire can be extremely short, and this mininizes its inductance, and thereby permits very high frequency operation.

Figure 5:
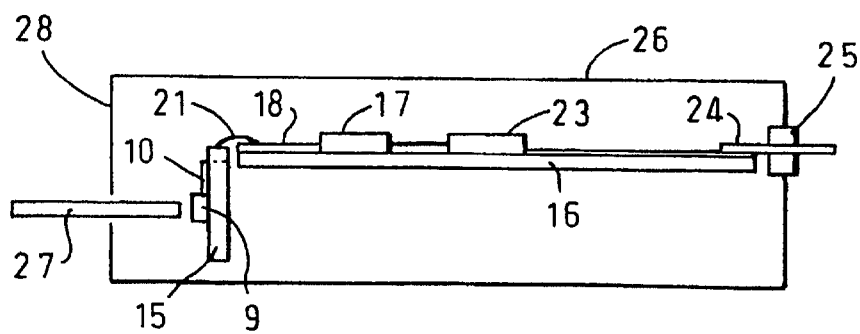
FIG. 5 illustrates diagrammatically a sectional view of such an arrangement.

Referring to FIG. 5, an optical interface arrangement is shown. It consists of the tile 15 mounted vertically, and the circuit board 16 mounted at right angles thereto.

As before the tile 15 carries a track 10 and a photodiode 9, and is connected via the bondwire 21 to track 18, on the board 16, and which is connected to the amplifier 17. Other electrical circuits, e.g., circuit 23, are mounted on the board 16 as required, and electrical connection 24 is made by any convenient means to an input/output electrical port 25 mounted in the wall of a housing 26. An optical fiber 27 passes through the opposite wall 28 of the housing, and terminates very close to the surface of the photodiode 9 to make a butt end optical connection therewith.

I claim:

1. An optical interface arrangement for interconnecting electrical and optical components, comprising:

a) a substrate for supporting one of the components, the substrate having a major surface lying in a plane, an edge located at a periphery of the substrate, and an electrically conductive, first track extending along the major surface of the substrate between said one component and the edge of the substrate;

b) a tile for supporting another of the components, the tile having a major surface lying in a plane perpendicular to the plane of the substrate, an edge located at a periphery of the tile and situated closely adjacent the edge of the substrate, a thickness, and an electrically conductive, second track extending along the major surface of the tile, and also along the thickness of the tile, between said other component and the edge of the tile;

c) a recess extending along the thickness of the tile at the edge of the tile; and d) an electrically conductive, elongated bondwire having one end electrically connected to the second track within the recess, and another end electrically connected to the first track, for linking the first and second tracks and the components.

2. The arrangement of claim 1, wherein the tile is constituted of a ceramic material.

3. The arrangement of claim 1, wherein the thickness of the tile is on the order of 250 µm.

4. The arrangement of claim 1, wherein the second track is a metallic layer.

5. The arrangement of claim 1, wherein the recess is bounded by a semicircular wall.

6. A method of interconnecting electrical and optical components, comprising the steps of:

a) forming a plurality of rows of holes through a tile sheet;

b) coating a plurality of walls bounding the holes with an electrically conductive material;

c) dividing the tile sheet into a plurality of planar tiles along parting lines that extend along each row of the holes, each tile having a peripheral edge at which a recess is formed from a respective hole divided by a respective parting line;

d) mounting one of the components on a respective tile in electrical connection with the electrically conductive material coated in a respective recess;

e) mounting a planar substrate perpendicular to the respective tile;

f) mounting another of the components on the substrate in electrical connection with an electrically conductive track provided on the substrate; and g) linking the track with the electrically conductive material coated in the respective recess by connecting one end of a bondwire to the track, and an opposite end of the bondwire to the electrically conductive material coated in the respective recess.

7. The method of claim 6, wherein the forming step is performed by constituting the tile sheet of a ceramic material.

8. The method of claim 6, wherein the coating step is performed by sequentially applying a plurality of metal layers.

9. The method of claim 6, wherein the coating step is performed by applying the electrically conductive material on opposite major surfaces of the tile sheet.

10. The method of claim 6, wherein the forming step is performed by forming each hole with a circular shape.

11. The method of claim 10, wherein the tile sheet has a thickness, and wherein each circular hole has a diameter greater than said thickness.

* * * * *